United States Patent [19]

Baron et al.

[11] 4,381,951

[45] May 3, 1983

[54] METHOD OF REMOVING CONTAMINANTS FROM A SURFACE

[75] Inventors: William J. Baron, Franklin Township, Somerset County; John T. Kenney, Lawrence Township, Mercer County; Wesley P. Townsend, Princeton Township, Mercer County, all of N.J.

[73] Assignee: Western Electric Co. Inc., New York, N.Y.

[21] Appl. No.: 341,723

[22] Filed: Jan. 22, 1982

Related U.S. Application Data

[62] Division of Ser. No. 872,194, Jan. 25, 1978, Pat. No. 4,322,457.

[51] Int. Cl.³ ............................................. B08B 30/00
[52] U.S. Cl. ...................................... 134/26; 134/29; 134/40
[58] Field of Search .......................... 134/4, 26, 29, 40

[56] References Cited

U.S. PATENT DOCUMENTS

| | | |
|---|---|---|
| 2,957,779 | 10/1960 | Bolton . |
| 3,011,920 | 12/1961 | Shipley . |
| 3,532,518 | 10/1970 | D'Ottavio . |
| 3,554,780 | 1/1971 | Miller . |
| 3,657,003 | 4/1972 | Kinney .................................. 204/30 |
| 3,839,083 | 10/1974 | Sihvonen . |
| 4,064,287 | 12/1977 | Lipson .................................. 427/259 |
| 4,073,981 | 2/1978 | Baron .................................... 427/259 |
| 4,100,037 | 7/1978 | Baron et al. ......................... 427/304 |

FOREIGN PATENT DOCUMENTS 2101619  7/1972  Fed. Rep. of Germany .

OTHER PUBLICATIONS

Narcus, "Metallizing of Plastics", Rheinhold Publishing Corp., NY, C–1960.
Air Products Technical Bulletin, entitled "Surfynol ® 400", Jun. 1972. APCI.
Air Products Technical Bulletin, entitled "Surfynol ® 104", Air Products and Chemicals Inc. 1976.

*Primary Examiner*—John D. Smith
*Attorney, Agent, or Firm*—Joel F. Spivak

[57] ABSTRACT

A method of removing contaminants from the surface is disclosed. The method comprises coating the surface with a surface active agent having a first surface energy and into which the contaminants are combined, applying thereover a higher surface energy colloidal sol and then allowing sufficient time for the first surface energy material with the contaminants combined therewith to migrate through the colloidal sol so as to remove the contaminants from the immediate vicinity of the substrate surface. The surface may then be treated by exposing it to an acid or base to remove the migrated surfactant layer thus removing the trace of contaminants.

2 Claims, 5 Drawing Figures

U.S. Patent  May 3, 1983  4,381,951
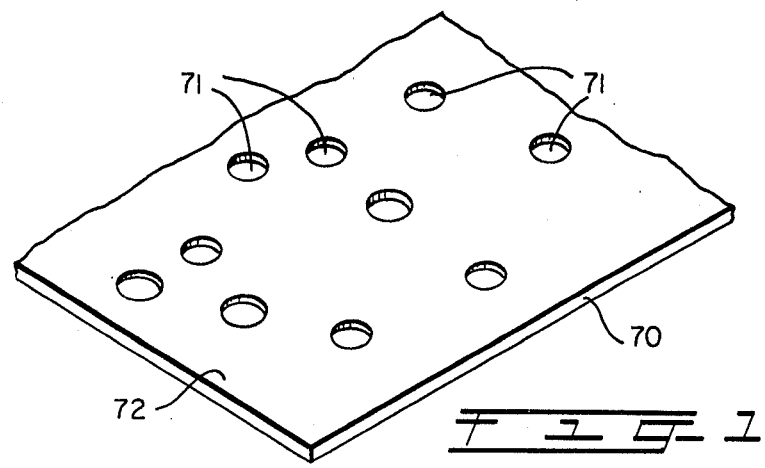
FIG-1
FIG-2
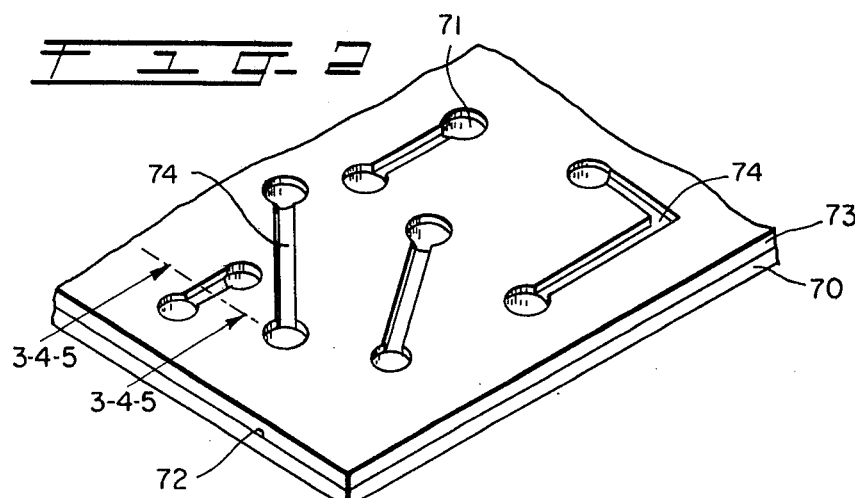
FIG-3
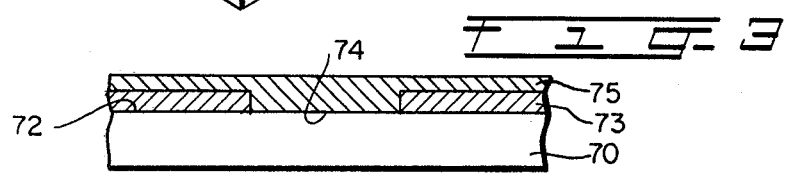
FIG-4
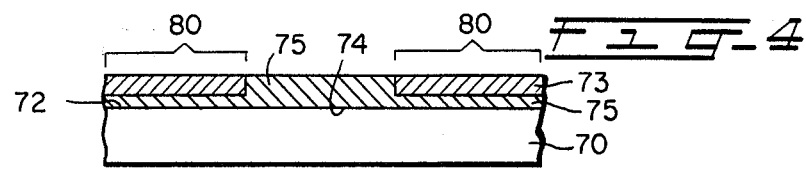
FIG-5
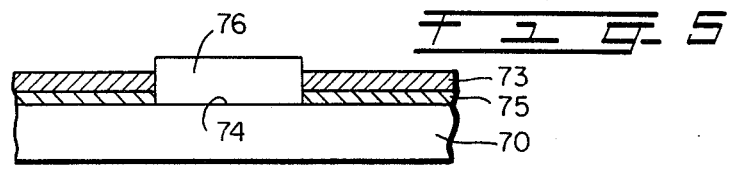

METHOD OF REMOVING CONTAMINANTS FROM A SURFACE

This is a division of application Ser. No. 872,194, filed Jan. 25, 1978, now U.S. Pat. No. 4,322,457.

BACKGROUND OF THE INVENTION

1. Field of the Invention

This invention relates to a method for removing trace contaminants from a surface and more particularly, to a method of removing such contaminants by means of combining said contaminants with a material having a first surface energy and causing their migration from the surface by applying a higher surface energy colloidal sol thereover.

2. Discussion of the Prior Art

There is a growing need in various device and circuit applications for an inexpensive process which will produce adherent conducting circuit patterns on a non-conductor surface. Most of the processes used for metallic pattern generation involve a photographic step. Pattern resolution may be good but most methods are often slow, involving many process steps, and are relatively expensive.

A conventional method for producing macro circuit patterns employs a copper-clad insulator board coated with a photoresist material which is photoexposed and chemically processed to selectively remove copper, leaving a desired circuit pattern. This method is effective but wasteful of copper and chemicals. The high cost of this method has encouraged research and development toward new techniques for metallic pattern generation on a non-conductor surface.

An electroless metal deposition process is especially attractive for metallic pattern generation since one only needs to produce a pattern of a suitable catalyst on a substrate and metal deposition will occur only on that pattern. A method for selective metal deposition utilizing an electroless metal deposition technique is desired and is needed.

There is also a need for a method for removing trace contaminants from a surface.

SUMMARY OF THE INVENTION

This invention relates to a method of selectively depositing a metal on a surface and more particularly, to a method of selectively depositing a metal on a surface of an electrically non-conducting substrate.

The method comprises selectively coating a portion of the surface with a surface active agent having a first surface energy to form a coated surface having a coated portion capable of burying a higher surface energy material applied thereto and an uncoated surface pattern not so capable. The selectively coated surface is then treated with a solution having a second surface energy, higher than the first, comprising a species selected from (1) a species capable of reducing an activating metal ion to an activating metal and (2) an activating metal species capable of participating in an electroless metal deposition, to form a surface having the species deposited atop the uncoated pattern.

The method is also applicable for the removal of trace contaminants from a surface wherein such contaminants combine with the surface active agent having the first surface energy referred to above, which layer with the combined contaminants is then allowed to migrate upwardly through the later applied higher surface energy material thereby removing the contaminants from the immediate vicinity of the surface such that it can be washed away thereafter.

DESCRIPTION OF THE DRAWINGS

The present invention will be more readily understood by reference to the following drawing taken in conjunction with the detailed description, wherein:

FIG. 1 is an isometric view of a portion of a typical substrate;

FIG. 2 is an isometric view of the portion of FIG. 1 which has been selectively coated with a surface active agent;

FIG. 3 is a partial cross-sectional view of the substrate of FIG. 2 taken along lines 3—3, 4—4 and 5—5 having a species deposited layer thereon capable of participating in an electroless metal deposition sequence;

FIG. 4 is a partial cross-sectional view of the substrate of FIG. 3 having a buried species deposited layer; and FIG. 5 is a partial cross-sectional view of the substrate of FIG. 4 which has been electrolessly metal deposited.

DETAILED DESCRIPTION

The present invention will be discussed primarily in terms of selectively depositing metallic palladium and copper on a surface of an electrically insulative substrate by conventional screen or dry offset printing means. It will be readily appreciated that the inventive concept is equally applicable to depositing other suitable metals, which are catalytically reduced from their respective ions by catalytic activating metals (Pt, Pd, Ag, Au, etc.). It will also be appreciated that the selective deposition may be carried out using any conventional printing technique such as lithography or wet offset, dry offset or letterset, letterpress, flexography, gravure, thermography, hot stamping and transfer printing techniques, as well as brushing and stenciling techniques.

Referring to FIG. 1, a suitable substrate 70 is selected. For the production of electrical circuit patterns, suitable substrates are those which are generally electrically non-conductive. In general, all dielectric materials are suitable substrates. Dielectric materials commonly employed comprise a resinous material. If desired, the resinous material may incorporate fibrous reinforcement. For instance, paper or cardboard, glass fiber or other fibrous material may be impregnated with a phenolic, epoxy or fluorohydrocarbon (e.g., polytetrafluoroethylene) resinous material and pressed or rolled to a uniform thickness. Ceramic substrates may likewise by selected. Illustratively, substrate 70 is provided with a plurality of through holes 71 which are drilled or punched in substrate 70 using any conventional technique known in the art.

Substrate 70 may then be cleaned or degreased employing techniques well known in the art. Referring to FIGS. 1 and 2, a suitable surface active agent or material is selectively applied to portions of surface 72 of substrate 70 to form a burying or masking coat or surface layer 73 which delineates an exposed surface pattern 74, including the walls of through-holes 71. A suitable surface active agent is any surfactant or surface active agent which has a first surface energy, typically 15 to 60 dynes per cm. at 25° C. The surface active agent is chemically compatible with surface 72, which surface may have a surface energy equal to, greater or less than the first surface energy, and with solutions containing a species capable of participating in an electroless metal deposition, to which surface 72 and burying coat or surface layer 73 is destined to be exposed. Some typical surface active agents include in part fluorocarbons, e.g., perfluoropolyacrylates, such as one designated "FC-430," obtained from Minnesota Mining and Manufacturing Company; silicones, e.g., siloxanes, such as the dimethoxypolysiloxane designated "L-45," obtained from Union Carbide Corporation; diols, such as for example 2, 4, 7, 9-tetramethyl-5-decyn-4,7-diol,

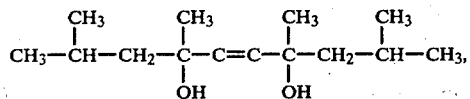

designated as "SURFONYL 104," obtained from Air Products and Chemicals, Inc.; diols obtained by reacting various amounts of ethylene oxide with the acetylenic glycol 2, 4, 7, 9-tetramethyl-5-decyne-4,7 diol having the structural formula of:

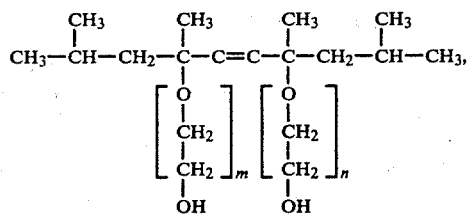

where m+n=N, number of moles of ethylene oxide, designated as "SURFONYL 400 series" surface active agents, available from Air Products and Chemicals, Inc.; and generally any non-ionic surface active agent.

If the surface active agent is not in a liquid state it is typically combined with a suitable solvent or liquid carrier to form a solution thereof. Typically, the surface active agent is in the form of an ink composition comprising a suitable liquid vehicle which is applied to surface 72 of substrate 70 using conventional printing techniques and dried or cured, if necessary, using conventional drying or curing techniques. One such conventional printing technique is screen printing. Another conventional printing technique is letterset printing. It is, of course, to be understood that the surface active material can be selectively applied to surface 72 using any conventional printing technique or other conventional technique including but not limited to brushing, stenciling, etc.

The burying coat or surface layer 73 is capable of migrating through any second material subsequently applied thereto which has a surface energy greater than its own. Thus, the use of the term "burying" since the surface active agent, comprising burying coat 73, migrates through the second material to form a coat thereover and thus bury it or mask it. Exposed or uncoated surface patterns, such as surface pattern 74, retain their original capability of retaining this second material without "burying" it or altering it in any fashion.

Where the surfactant is applied to surface 72 in the form of an ink, the surfactant migrates through the ink to the top thereof upon subsequent drying and/or curing. Typically, the migration of the surfactant is evidenced by conventional Electron Spectroscopy for Chemical Analysis (ESCA) which detects elements greater than Mg in the periodic table within the first 10A. to 50A. of a coating. For example, where the surface active agent comprises a fluorocarbon, fluorine is the detected element which determines the degree of migration.

The resultant substrate 70 having coated surface 73 and uncoated surface 74 is treated with a suitable sensitizing solution or a suitable sensitizing sol capable of participating in an electroless metal deposition sequence, by being capable of reducing a precious metal, e.g., palladium, platinum, silver, gold, from a salt solution thereof. A suitable sensitizing solution or sol is one having a surface energy greater than the surface energy of the surface active agent employed to form burying coat 73, e.g., it being typically in excess of 60 dynes per cm. at 25° C. Suitable sensitizing solutions comprise aqueous or non-aqueous solutions containing $Sn^{+2}$, $Ti^{+3}$, $V^{+4}$, $Cr^{+3}$, $Fe^{+2}$, $Pb^{+2}$, $Bi^{+3}$ ions. Such sensitizing solutions are well known in the electroless metal deposition art and will not be elaborated herein.

A suitable sol includes at least one wetting hydrosol revealed in Kenney, U.S. Pat. No. 3,657,003, incorporated hereinto by reference. More specifically, the following wetting hydrosols revealed in Kenney may be employed:

(1) The blue wetting sol of Example III-A which is obtained by (a) adding particulated titanium metal [$Ti^o$] to a hot or boiling (about 80° C.) concentrated monobasic acid, such as HCl, until 0.2–3 weight percent of the titanium is dissolved; (b) cooling the resultant solution to room temperature; and (c) slowly raising the initial pH with a univalent alkali such as NaOH, until it is within the range of about 1.0 to 1.5.

(2) The blue wetting sol of Example III-B which is obtained by (a) adding particulated titanium metal [$Ti^o$] to a hot or boiling (about 80° C.) concentrated univalent acid, such as $HNO_3$, until 0.2–3 weight percent of the titanium is dissolved; (b) cooling the resultant solution to room temperature; and (c) slowly raising the initial pH, with a univalent alkali, such as NaOH, until it is within the range of about 1.0–1.4.

(3) The brown-red wetting sol of Example V-C which is obtained by (a) adding one-half weight percent of vanadium tetrachloride [$VCl_4$] to concentrated HCl; and (b) raising the pH to about 1, e.g., by diluting with $H_2O$.

(4) The green wetting sol of Example VI which is obtained by (a) dissolving one-half weight percent of chromic chloride in 100 ml. of deionized water; and (b) raising the initial pH to about 5 with a univalent alkali.

(5) The wetting sol of Example X-G which is obtained by (a) adding one weight percent of powdered ferrous oxide to 100 ml. of deionized water; (b) ultrasonically agitating the resultant mixture to dissolve the $Fe_2O_3$; and (c) lowering the initial pH (3.0–3.5) to about 1.0 with a univalent acid, such as HCl.

(6) The pale yellow wetting sol of Example XXVI-F which is obtained by (a) dissolving in 100 ml. of deionized water 0.1–5 weight percent of stannous chloride [$SnCl_2$] and 0.2–5 weight percent (with respect to the $H_2O$) of stannic chloride [$SnCl_4$] in any proportion to each other; and (b) adjusting the pH to about 0.7–1.8.

(7) The pale yellow wetting sol of Example XXVI-G which is obtained by (a) dissolving 1 weight percent of powdered stannic chloride [$SnCl_4.5H_2O$] in 100 ml. of deionized water; (b) dissolving 2 weight percent of stannous chloride [$SnCl_2.2H_2O$] therein; and (c) dissolving an additional 1.5 weight percent stannous chloride [$SnCl_2.2H_2O$].

(8) The pale yellow wetting sol of Example XXVI-H which is obtained by (a) dissolving 1 weight percent of stannous chloride [$SnCl_2.2H_2O$] in 100 ml. of deionized water; (b) adding sufficient HCl thereto to lower the pH to about 0.5–1.5; and (c) heating the resultant solution at about 55° C. for 2 hours or in the alternative, adding $H_2O_2$ in place of or in addition to the heating step.

(9) The colorless (milky white) wetting sol of Example XXVII which is obtained by (a) dissolving 1 weight percent of either lead chloride [$PbCl_2$] or lead nitrate [$Pb(NO_3)_2$] in 100 ml. of deionized water; and (b) slowly raising the initial pH of the resultant solution with a dilute univalent alkali, such as NaOH, to a pH of about 6–7.

(10) The colorless (milky white) wetting sol of Example XXVIII which is obtained by (a) dissolving 1 weight percent of bismuth trichloride [$BiCl_3$] in 100 ml. of dilute (pH about 2) HCl; and (b) raising the pH of the resultant solution to about 3.4 with NaOH.

(11) The wetting sol of Example XXXIII-A which is obtained by (a) adding 1 gram of fused titanium metal [$Ti^o$] to 70 ml. of concentrated HCl, which is boiled until the solution assumes a blue color; (b) maintaining a heat input without boiling the resultant solution until all of the titanium is dissolved and reacted to give a blue-purple solution having a very low pH; (c) raising the pH to about 0.5 with 1 N—NaOH resulting in a pale lavender solution; (d) adding dilute 50% $H_2O_2$ until the solution is colorless, and then adding two additional drops in excess; (e) raising the pH with 1 N—NaOH to about 1.0–1.2, resulting in a pale yellow solution; and (f) adding 1 weight percent of stannous chloride to 100 ml. of the pale yellow solution.

(12) The pumpkin colored wetting sol of Example XXXIII-B which is obtained by (a) dissolving 1 weight percent of ferric chloride [$FeCl_3.6H_2O$] in 100 ml. of deionized water (aiding dissolution by gradually heating to about 50°–80° C. and stirring), resulting, at a pH of about 1.7–1.9, in a tan solution; and (b) dissolving 2 weight percent stannous chloride [$SnCl_2.2H_2O$] in 100 ml. of the tan solution thereby lowering the pH to about 1.5.

(13) The wetting sol of Example XXXIII-C which is obtained by (a) heating 100 ml. of deionized water to about 60° C.; (b) adding 1 weight percent of aluminum chloride [$AlCl_3.6H_2O$] thereto; (c) raising the initial pH (about 2.5) to about 5.0–5.2 while the solution is still hot, with a univalent alkali such as 1 N—NaOH; (d) cooling the solution to room temperature; and (e) dissolving 0.1 weight percent of stannous chloride [$SnCl_2.2H_2O$] therein.

(14) The pale yellow wetting sol of Example XXXIII-D which is obtained by dissolving 1 weight percent of ferric chloride [$FeCl_3.6H_2O$] and 1 weight percent of stannous chloride [$SnCl_2.2H_2O$] in 100 ml. of deionized water.

(15) The pale yellow wetting sol of Example XXXIII-E which is obtained by (a) dissolving 1 weight percent of ferric chloride [$FeCl_3.6H_2O$] and 1 weight percent of stannous chloride [$SnCl_2.2H_2O$] in 100 ml. of deionized water; and (b) dialyzing the solution to a final pH of about 5–5.5.

(16) The colorless (milky white) wetting sol of Example XXXIII-F which is obtained by adding 1 weight percent of stannous chloride [$SnCl_2.2H_2O$] to a suspension of "CAB-O-SIL" in 100 ml. of deionized water.

"CAB-O-SIL" is a fumed silica made by flame hydrolysis.

(17) The yellow setting sol of Example XXXIII-G which is obtained by (a) dissolving 1–2 weight percent of stannic chloride [$SnCl_4.5H_2O$] in 100 ml. of deionized water and (b) adding 1–5 weight percent of zinc metal thereto with stirring until complete dissolution thereof.

(18) The yellow wetting sol of Example XXXIII-H which is obtained by (a) dissolving 1–3 weight percent of stannous chloride [$SnCl_2.2H_2O$] in 100 ml. of deionized water; (b) adding sufficient HCl to clear the solution, the final pH of the cleared solution being 0.5–1.0; and (c) dissolving 1 weight percent of zinc metal therein.

(19) The green wetting sol of Example XXXIII-I which is obtained by (a) dissolving 0.5 percent of chromic chloride [$CrCl_6.6H_2O$] in 100 ml. of deionized water; (b) adding 0.25 weight percent of zinc metal to the solution; (c) allowing the solution to stand ambient for at least 48 hours; (d) adding stannous chloride [$SnCl_2.2H_2O$] to the solution in a weight concentration of 0.1 percent per 100 ml.; and (e) slowly adding 1 N—NaOH to the solution to adjust the pH to the range 5.1–5.4.

(20) The wetting sol of Example XXXIII-J which is obtained by (a) adding 1 weight percent of powdered aluminum chloride [$AlCl_3$] to 100 ml. of deionized water; (b) raising the pH to about 5.2 with a univalent alkali such as NaOH; (c) heating the solution for about 2 hours at about 60°–80° C.; (d) adding 0.5–2 weight percent of stannous chloride [$SnCl_2.2H_2O$] to form a flocculant; (e) decanting the supernatant portion of the solution which portion is the colloid wetting solution and additionally (f) adding 0.01 M—HCl to the flocculant to form the wetting solution also.

The sols of Examples III-A, III-B, V-C, VI, X-G, XXVI-F, XXVI-G, XXVI-H, XXVII, XXVIII, XXXIII-A, XXXIII-B, XXXIII-C, XXXIII-D, XXXIII-E, XXXIII-F, XXXIII-G, XXXIII-H, XXXIII-I, and XXXIII-J (described above) comprise metal ions ($Ti^{+3}$, $V^{+4}$, $Cr^{+3}$, $Fe^{+2}$, $Sn^{+2}$, $Pb^{+2}$, $Bi^{+3}$) in insoluble hydrous oxide form, which are capable of reducing an activating metal ion, e.g., $Pd^{+2}$, to an activating metal, e.g., Pd, upon exposure to an activating solution, e.g., a $PdCl_2$ solution.

It is to be pointed out that in general stannous chloride while present in aqueous hydrochloric acid does not form a true solution, but rather a colloidal suspension which may be termed a sol. Accordingly, such sols are suitable for practicing the subject invention.

Upon treatment or contact with the sensitizing solution or the sensitizing sol, the sensitizing species contained therein, e.g., colloidal hydrous oxide particles of tin ($Sn^{+2}$), are deposited on coated surface 73 and uncoated surface 74 to form a species deposited film or coat 75 thereof (greatly enlarged for illustrative purposes only) thereon as shown in FIG. 3. Referring to FIG. 4, after a suitable time period, e.g., typically less than 4 hours at 25° C., burying layer 73 containing the surface active material migrates through deposited film or coat 75 to bury film 75 thereunder to form a masking pattern 80 which delineates film or coat 75 deposited atop of uncoated surface 74. A sufficient period of time is allowed to pass in order to insure that burying layer 73 has diffused sufficiently to block the sensitizing effect of the deposited film 75 (FIG. 3). Such a period of time is easily ascertained without an undue amount of experimentation in view of the disclosure provided herein.

Resultant substrate 70 containing masking pattern 80 may be rinsed with an inert rinsing agent, e.g., water, to remove excess solution or sol therefrom and then dried using conventional techniques, e.g., air dried at 20° C. for 1 minute. Dried, sensitizing species deposited substrate 70 is then activated, i.e., is exposed in a conventional manner, e.g., by immersion, to an activating solution, e.g., an aqueous $PdCl_2$ solution, containing an activating metal ion, e.g., $Pd^{+2}$, $Pt^{+2}$, $Ag^{+1}$, $Au^{+1}$, etc., wherein the activating metal ion, e.g., $Pd^{+2}$, is reduced to the metal, e.g., Pd, and deposited only on surface 74 of the substrate 70 in the form of a catalytic activating metal pattern (not shown) to activate surface 74. The patterned, activating metal-deposited substrate 70 may then be water rinsed and is then immersed in a conventional electroless metal deposition solution wherein an electroless metal ion, e.g., $Cu^{+2}$, $Ni^{+2}$, is reduced to the metal, e.g., $C^o$, $Ni^o$ and deposited on activated surface 74 of substrate 70 to form an electroless metal deposit 76 as shown in FIG. 5. Electroless metal deposit 76 may be built up to a desired thickness by prolonged immersion in the electroless metal deposition solution or alternatively may be further built up by being electroplated in a standard electroplating bath.

Electroless metallization does not occur on surface areas underlying coat 73 of masking pattern 80 since the sensitizing species of layer 75 (FIG. 3, FIG. 4) is now effectively blocked or buried in masking pattern 80 and therefore cannot reduce the activating metal ion, e.g., $Pd^{+2}$, to the metal, e.g., $Pd^o$. Thus, activation and subsequent electroless metallization thereof does not take place.

In another embodiment of the present invention, referring back to FIGS. 2 and 3, substrate 70 is treated with a solution or a sol containing an activating metal species (colloidal or non-colloidal) capable of participating in an electroless metal deposition, to deposit the activating metal species, e.g., a hydrous oxide of palladium, on coated surface 73 and uncoated surface 74 to form species deposited film or coat 75 thereon. By a suitable activating species which can participate in an electroless metal deposition is meant either (1) an activating species which in its initial state is incapable of functioning as a catalytic species or metal but which is capable of being reduced to a catalytic species, such as a metal, capable of functioning as a reduction catalyst in an autocatalytic electroless deposition process, or (2) an activating species which in its initial state is capable of functioning as such a catalytic species.

Suitable activating metal solutions or sols are those having a surface energy in excess of that of the surface active agent comprising coat 73, e.g., typically greater than 60 dynes per cm. at 25° C. Suitable activating solutions comprise aqueous or non-aqueous solutions of activating metal salts, e.g., $PdCl_2$, which are well known to those skilled in the electroless metal deposition art and will not be elaborated herein.

Some suitable activating sols capable of reduction to a catalytic species include those revealed in Kenney, U.S. Pat. No. 3,657,003. In particular, some of these sols are:

(1) The brown wetting sol of Example XIII-A which is obtained by (a) adding one weight percent of palladium chloride [$PdCl_2$] to 100 ml. of deionized water; and (b) stirring the resultant mixture to dissolve the maximum amount of $PdCl_2$.

(2) The brown wetting sol of Example XIII-B which is obtained by (a) adding 10 ml. of 5 weight percent palladium chloride [$PdCl_2$] to 100 ml. of deionized water; and (b) raising the initial pH to about 3.0–3.2 with 1 N—NaOH.

(3) The yellow wetting sol of Example XIV which is obtained by (a) dissolving one weight percent of platinous dichloride [$PtCl_2$] in 100 ml. of hot (70° C.), dilute HCl; (b) cooling the resultant solution; and (c) raising the pH of the cooled solution to about 3 with a univalent alkali.

(4) The wetting sol of Example XVI which is obtained by dissolving ¼–½ weight percent of silver nitrate [$AgNO_3$] in either 100 ml. of deionized water or in 100 ml. of 50 percent deionized water and 50 percent ethyl alcohol and rapidly raising the pH to an ultimate value of 8–9 with a univalent alkali such as KOH or NaOH.

(5) The brown wetting sol of Example XVII-A which is obtained by (a) dissolving one weight percent of auric chloride [$AuCl_3$] in 100 ml. of deionized water; and (b) slowly raising the pH to about 4–5 with a univalent alkali while stirring and heating (30°–40° C.) the resultant solution.

(6) The yellow wetting sol of Example XVII-B which is obtained by (a) dissolving ½–1 weight percent of auric chloride in 100 ml. deionized water; and (b) slowly evaporating the resultant solution in ambient until one-fifth of the volume remains [2–4 weeks].

(7) The brown wetting sol of Example XVII-C which is obtained by (a) dissolving 1 weight percent of auric chloride in 100 ml. of deionized water; and (b) raising the pH of the resultant solution to about 4 with NaOH.

Substrate 70 is treated with the activating solution or sol, e.g., by immersion for 2 minutes at 25° C., whereby species deposited film 75, comprising the activating species, is obtained as shown in FIG. 3. Migration or diffusion of burying coat 73 takes place to form masking pattern 80 as shown in FIG. 4 in which the activating species is blocked or buried and therefore cannot be subsequently reduced upon exposure to a suitable reducing agent.

Substrate 70 is then treated with the inert rinsing agent, e.g., is rinsed with water, to remove excess solution or sol therefrom. The colloidal activating metal species, deposited and retained, is capable of participating in an electroless metal deposition catalysis. That is, activating metal species (associated, e.g., an insoluble hydrous oxide of palladium; dissociated, e.g., $Pd^{+2}$ ions) contained in the above-described wetting sols and retained on surface 74 is capable of forming a catalytic metal (a metal capable of functioning as a reduction catalyst in an autocatalytic electroless process), e.g., by being reduced thereto by a suitable reducing agent, such as $Sn^{+2}$ ions or

(alone or combined in an electroless plating solution).

Activating metal species deposited substrate 70 is dried and then treated by a solution comprising a reducing species, e.g., $Sn^{+2}$ ions, capable of reducing the retained activating metal species to an activating metal, e.g., $Pd^o$. Upon such treatment, the activating metal ion, e.g., $Pd^{+2}$, $Pt^{+2}$, etc., is reduced to the activating metal, e.g., Pd, Pt, and deposited only on patterned surface 74 as a catalytic coat or pattern. An activating metal is not deposited on surface 72 underlying coat 73 since the activating species is masked or blocked thereat in masking pattern 80. The activating metal-deposited catalyst pattern is then subjected to a conventional electroless metal plating bath to obtain the metal-deposited pattern 76 (FIG. 5). Again, pattern 76 may be built up to a desired thickness by continued electroless deposition or alternatively the electroless metal-deposited pattern 76 may be electroplated using conventional electroplating techniques and plating baths.

Suitable colloidal sols comprising activating species, capable of participating in an electroless metal deposition, by initially being capable of functioning as a reduction catalyst for the electroless metal deposition, exist as so-called "one-step activators." The substrate 70 may be treated with such a colloidal one-step activator whereby metallic palladium is initially deposited on surfaces 73 and 74 followed by the burying thereof by coat 73. One such typical colloidal one-step activator, revealed in U.S. Pat. No. 3,011,920, contains stannous chloride, palladium chloride and aqueous hydrochloric acid. Colloidal palladium is formed by the reduction of the palladium ions by the stannous ions of the stannous chloride. Simultaneously, stannic oxide colloids are formed together with adsorbed stannic oxychloride and stannic chloride. The stannic acid colloids comprise protective colloids for the palladium colloids while the oxychloride constitutes a deflocculating agent further promoting the stability of the resulting colloidal solution. The relative amounts of the above ingredients can be varied provided the pH is below about 1 and provided excess stannous ions are maintained.

Another suitable colloidal one-step activator, revealed in U.S. Pat. No. 3,532,518 incorporated hereinto by reference, comprises acid palladium metal-stannous chloride sols.

When employing such one-step activators it is unnecessary to form or apply a further layer of a noble metal species on surface 74 since the activating metal species deposited is initially capable of participating in an electroless metal deposition catalysis. Accordingly, the thus one-step activator treated substrate 70, containing buried metallic palladium, can be dried, and immediately immersed in a suitable electroless metal deposition bath.

It is to be noted that the various typical conventional activators, activating solutions, electroless and electroplating solutions, activating and plating conditions and procedures are well known in the art and will not be elaborated herein. Reference in this regard is made to *Metallic Coating of Plastics*, William Goldie, Electrochemical Publications, 1968.

In another embodiment, trace contaminants having a surface energy, e.g., 15 to 60 dynes per cm. at 25° C., are removed from a surface of a substrate. The surface is treated with the surface active material having a low surface energy, referred to above, to form a surface active layer comprising the surface active material combined with the contaminants. The surface, having the surface active layer, is treated with any of the wetting colloids revealed in Kenney, U.S. Pat. No. 3,657,003, which have a surface energy in excess of that of the surface active material and the contaminants, to form a wetting colloid layer atop the surfactant layer. After a period of time, e.g., 30 seconds to 4 hours at 25° C., the surfactant or surface active layer migrates through the wetting colloid layer carrying the trace contaminants combined therewith. The surface is then treated, such as by being exposed to an acid, e.g., aqua regia, or a base, e.g., aqueous NaOH, to remove the migrated surfactant layer and thus remove the trace contaminants.

EXAMPLE I

An ink was prepared by mixing (1) 75 grams of a commercially obtained diglycidyl ether of bisphenol A having an epoxide equivalent weight of 180–195, and a viscosity at 25° C. of 10,000–16,000 centipoise (designated as "EPON 828," obtained from Shell Chemical Company); (2) 25 grams of a substantially anhydrous water-soluble thermosetting stable methylated urea-formaldehyde resin wherein the weight of the methoxyl substituents therein is between 28% and 40% of the weight of the resin and the molar ratio of the reacted formaldehyde in the resin to the methoxyl substituents is such that in the absence of organic solvent the resin at 25° C. is soluble to the extent of at least 50% by weight in water and dissolves at least 50% of its weight of toluene, the polymeric form of the resin being not substantially in excess of tetrameric, the molar ratio of reacted urea to reacted formaldehyde in the resin and the molar ratio of reacted formaldehyde to reacted methanol therein being within the ranges:

| | Molar ratio | | | | |
|---|---|---|---|---|---|
| Ranges | Urea | :CH$_2$O | :CH$_3$OH | CH$_2$O | :CH$_3$OH |
| Lower | 1 | 2.2 | 1.3 | 1 | 1.10 |
| Upper | 1 | 2.8 | 2.0 | 1 | 2.15 | and the resin consisting essentially of:

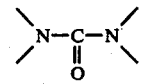

units, —CH$_2$ bridges between the units, and —H, —CH$_2$OH and —CH$_2$OCH$_3$ substituents (commercially obtained from American Cyanamid Company and designated as "Beetle 65"); (3) 0.05 grams of a commercially obtained 100% active nonionic surface active agent comprising a perfluoropolyacrylate having surface energy of 23 dynes per cm. at 21° C. (known as "FC-430" obtained from the Minnesota Mining and Manufacturing Company).

The resultant ink was then conventionally offset printed and heated at 175° C. for 15 minutes in a pattern on a surface of an epoxy-glass laminate (having a surface energy of 40 dynes/cm.) to form an inked surface pattern thereon. The heating resulted in a simultaneous curing of the ink and migration of the low surface energy surfactant to the top surface of the inked pattern as evidenced by appearance of the surface active agent at the top surface by Electron Spectroscopy for Chemical Analysis (ESCA). Fluorine was detected at the top surface of the inked pattern, as evidenced by a peak at a binding energy of 686 electron volts for the fluorine 1s electron relative to a carbon 1s electron at 284 electron volts.

A sensitizing sol was prepared by dissolving ten grams of stannic chloride (SnCl$_4$) in 1000 ml of deionized water. Fifteen grams of stannous chloride (SnCl$_2$) were dissolved in the resultant solution followed by the addition of twenty grams of stannous chloride. The inked substrate was immersed in the resultant sensitizing sol for 1 minute at 25° C. and then rinsed with deionized water at 25° C. for two minutes. The sensitized substrate was then dried under a nitrogen gas ambient at room temperature (about 20° C.) for one minute under a positive nitrogen ambient pressure. ESCA measurements were then immediately carried out which indicated that the surface active agent had not migrated through the resultant sensitizer layer. After 4 hours at 25° C., ESCA measurements were again made which indicated that the surface active agent had migrated from the top surface of the inked pattern to the top surface of the sensitizer layer. The sensitized substrate was then treated with a commercially obtained activating solution comprising $PdCl_2$ to activate the surface only in those areas of the surface not coated with the ink pattern. The activated surface was then immersed for 10 minutes at 25° C. in an electroless copper deposition solution, comprising 15 grams/L. of solution, of cupric sulfate, 3 grams/L. of solution of $NiSO_4.6H_2O$, 9 grams/L. of solution of formaldehyde, 30 grams/L. of solution of sodium potassium tartrate, 8 grams/L. of solution of NaOH and 1 ppm $Na_2SO_3.7H_2O$ wherein an electroless copper pattern corresponding to non-inked, exposed areas of the substrate surface, having a thickness of $2.54 \times 10^{-5}$ cm. was obtained. There was no metal deposition on the inked areas of the substrate surface.

EXAMPLE II

The procedure of Example 1 was repeated except that the ink comprised 0.5 gram of the surface active agent. Essentially the same results as in Example I were obtained.

EXAMPLE III

The procedure of Example I was repeated except that the ink comprised 1 gram of the surface active agent. Essentially the same results as in Example I were obtained.

EXAMPLE IV

The procedures of Examples I, II and III were repeated except that 100 grams of a commercially obtained epoxy ink having a surface energy of 35–40 dynes/cm. at 25° C. (designated as ink #7224 obtained from the Markem Corporation, Keene, N.H., was employed. Essentially the same results as in Examples I, II and III were obtained.

EXAMPLE V

The procedures of Examples I, II, III and IV were repeated except that 100 grams of a commercially obtained ink having a surface energy of 35–40 dynes/cm. at 25° C. (designated as ink #7224, obtained from the Markem Corporation, Keene, N.H.), were combined with a commercially obtained surface active agent having a surface energy of 19.5–21.5 dynes/cm. at 25° C. and comprising a dimethoxy polysiloxane of the following structural formula:

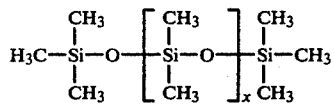

where x is a number of repeated units, and having a viscosity of 10 through 500,000 centistokes at 25° C. (designated as "L-45" obtained from Union Carbide Corporation). Essentially the same results as in Examples I, II, III and IV were obtained.

It is to be understood that the above-described embodiments are simply illustrative of the principles of the invention. Various other modifications and changes may be made by those skilled in the art which will embody the principles of the invention and fall within the spirit and scope thereof.

What is claimed is:

1. A method of removing contaminants from a surface wherein the contaminants have a surface energy of from 15 to 60 dynes per centimeter at 25° C., which comprises:
   treating the surface with a material having a first surface energy to combine said material with the contaminants to form a surface having a coat comprising said combined material and contaminants; and
   treating said coated surface with a sol having a second surface energy which is greater than said first surface energy to sequentially form a layer of the colloidal species of said sol on said coat, allowing sufficient time to cause migration of said combined material and contaminants from said coat through said layer to the top thereof to form a top layer of said combined material and contaminants.

2. The method as defined in claim 1 which further comprises removing said top layer of said combined surfactant and contaminants.

* * * * *